United States Patent
Chadha et al.

(10) Patent No.: US 12,224,192 B2
(45) Date of Patent: Feb. 11, 2025

(54) BOWED SUBSTRATE CLAMPING METHOD, APPARATUS, AND SYSTEM

(71) Applicant: Applied Materials, Inc., Santa Clara, CA (US)

(72) Inventors: Arvinder S. Chadha, San Jose, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 190 days.

(21) Appl. No.: 17/984,357

(22) Filed: Nov. 10, 2022

(65) Prior Publication Data
US 2024/0162066 A1 May 16, 2024

(51) Int. Cl.
*H01L 21/67* (2006.01)
*H01J 37/32* (2006.01)
*H01L 21/683* (2006.01)

(52) U.S. Cl.
CPC .... *H01L 21/67288* (2013.01); *H01L 21/6831* (2013.01); *H01J 37/32715* (2013.01); *H01J 2237/2007* (2013.01)

(58) Field of Classification Search
CPC ........... H01L 21/67288; H01L 21/6831; H01L 21/6833; H01J 37/32715; H01J 2237/2007
USPC ........................................................ 361/234
See application file for complete search history.

(56) References Cited

U.S. PATENT DOCUMENTS

| | | | |
|---|---|---|---|
| 7,142,406 B2 * | 11/2006 | Kwon | H01L 21/6833 361/234 |
| 9,824,894 B2 | 11/2017 | deVilliers | |
| 10,811,265 B2 | 10/2020 | deVilliers | |
| 11,380,573 B2 * | 7/2022 | Hayashi | H01L 21/68757 |
| 2013/0088808 A1 | 4/2013 | Parkhe et al. | |
| 2013/0088809 A1 | 4/2013 | Parkhe et al. | |
| 2016/0322234 A1 | 11/2016 | Lew et al. | |
| 2018/0122680 A1 * | 5/2018 | Yang | H01J 37/32642 |
| 2021/0175108 A1 * | 6/2021 | Verbaas | H01L 21/6833 |
| 2021/0366696 A1 | 11/2021 | Lee et al. | |
| 2022/0262643 A1 * | 8/2022 | Nittala | H01L 21/324 |
| 2022/0310431 A1 * | 9/2022 | Deng | H01L 21/6833 |

OTHER PUBLICATIONS

United States U.S. Appl. No. 17/410,958, filed Aug. 24, 2021.
PCT International Search Report and Written Opinion for PCT/US2023/034883 dated Feb. 8, 2024.

* cited by examiner

*Primary Examiner* — Dharti H Patel
(74) *Attorney, Agent, or Firm* — MOSER TABOA

(57) ABSTRACT

Methods and apparatus for clamping a substrate comprise i. placing a substrate on a clamping surface of a substrate support having a plurality of electrodes spaced from one another including a first electrode and a second electrode; ii. measuring substrate bow of the substrate; iii. determining, based on the measured substrate bow, a first voltage to be applied to the first electrode and a second voltage to be applied to the second electrode, wherein the first voltage is an AC voltage and the second voltage is an AC or a DC voltage; and iv. applying the first voltage to the first electrode and the second voltage to the second electrode to clamp the substrate to the substrate support.

17 Claims, 9 Drawing Sheets

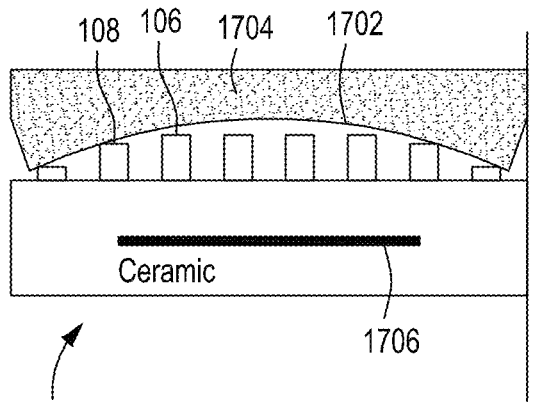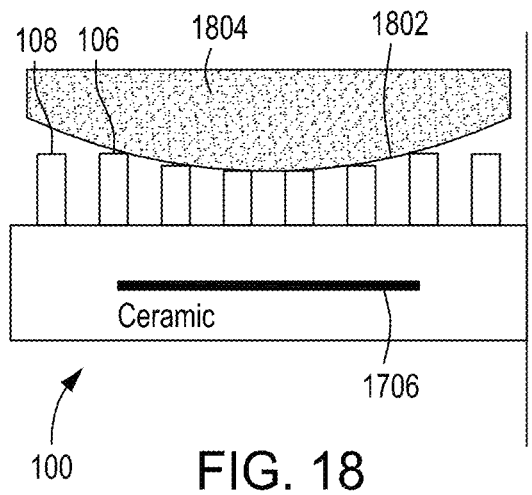
FIG. 17
FIG. 18
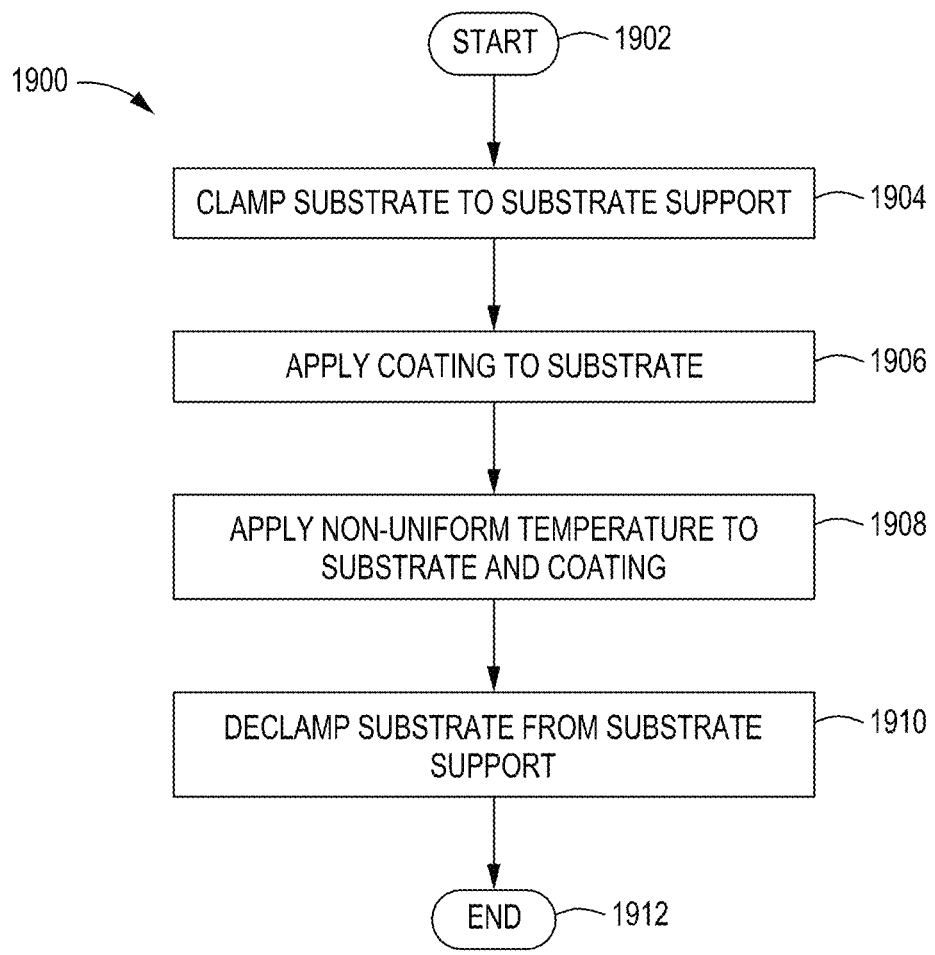
FIG. 19

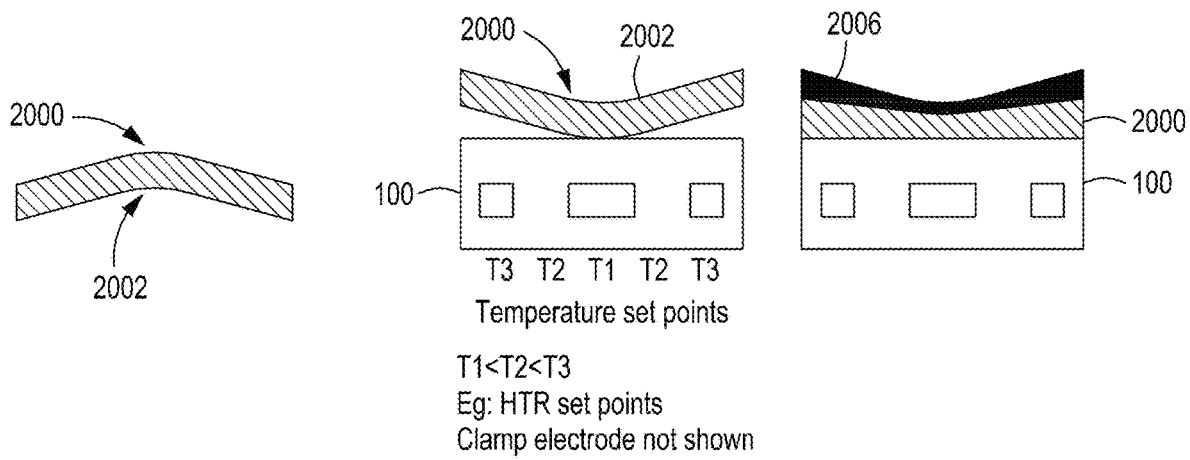
FIG. 20
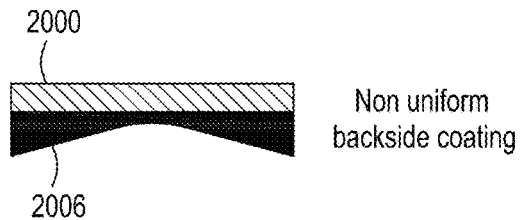
FIG. 21
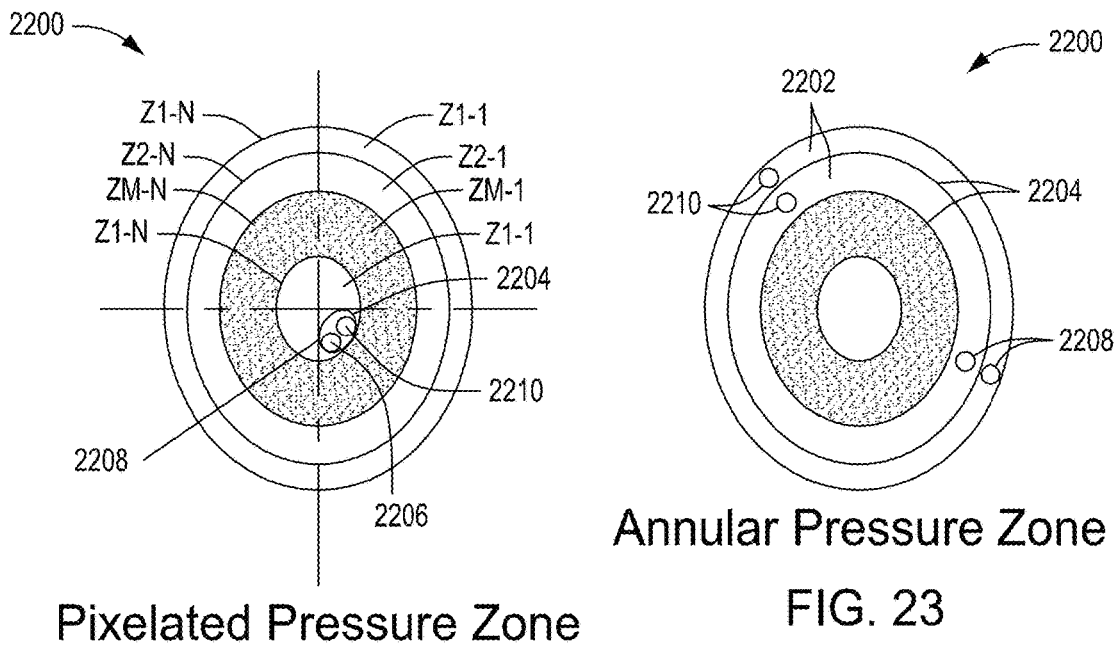
Pixelated Pressure Zone
FIG. 22
Annular Pressure Zone
FIG. 23

BOWED SUBSTRATE CLAMPING METHOD, APPARATUS, AND SYSTEM

FIELD

Embodiments of the present disclosure generally relate to a substrate clamping and more particularly to clamping of bowed substrates.

BACKGROUND

Substrates, such as semiconductor wafers, may be bowed to an extent that may make clamping the substrates to a chuck more difficult. For example, such bowed substrates may be difficult to clamp to an electrostatic chuck (ESC) without unacceptably high clamping voltages due to large gaps between the ESC and the substrate. The high clamping voltages cause large clamping forces between some areas of the substrate and the ESC, which may increase friction between the substrate and the ESC leading to unwanted particle generation.

Thus, the inventors propose new methods, systems, and apparatus for clamping substrates that can accommodate bowed substrates using lower clamping voltages to reduce or eliminate unwanted particle generation.

SUMMARY

Methods and apparatus for clamping a substrate are provided herein. In some embodiments, a method for clamping a substrate includes i. placing a substrate on a clamping surface of a substrate support having a plurality of electrodes spaced from one another including a first electrode and a second electrode; ii. measuring substrate bow of the substrate; iii. determining, based on the measured substrate bow, a first voltage to be applied to the first electrode and a second voltage to be applied to the second electrode, wherein the first voltage is an AC voltage and the second voltage is an AC or a DC voltage; and iv. applying the first voltage to the first electrode and the second voltage to the second electrode to clamp the substrate to the substrate support.

In some embodiments, a system for clamping a substrate includes a substrate support having a surface for supporting a substrate; a plurality of electrodes spaced from one another in or on the substrate support, the plurality of electrodes including a first electrode and a second electrode; and a controller configured to receive a measurement of substrate bow of a substrate and to determine, based on the substrate bow, a first voltage to be applied to the first electrode and a second voltage to be applied to the second electrode, and apply the first voltage to the first electrode and the second voltage to the second electrode, wherein the first voltage is an AC voltage and the second voltage is an AC or DC voltage.

In some embodiments, a non-transitory computer readable storage medium having instructions stored thereon that, when executed by a processor of a system for clamping a substrate having a substrate support with a plurality of electrodes spaced from one another including a first electrode and a second electrode, performs a method of clamping a substrate includes: i. placing a substrate on a clamping surface of a substrate support having a plurality of spaced electrodes including a first electrode and a second electrode; ii. measuring substrate bow of the substrate; iii. determining, based on the measured substrate bow, a first voltage to be applied to the first electrode and a second voltage to be applied to the second electrode, wherein the first voltage is an AC voltage and the second voltage is an AC or DC voltage; and iv. applying the first voltage to the first electrode and the second voltage to the second electrode.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 17 shows another embodiment of a substrate support in accordance with embodiments of the present disclosure.

FIG. 18 shows another embodiment of a substrate support in accordance with embodiments of the present disclosure.

FIGS. 19-21 show a method of controlling bow of a substrate in accordance with embodiments of the present disclosure.

FIG. 22 shows another embodiment of a substrate support in accordance with embodiments of the present disclosure.

FIG. 23 shows another embodiment of a substrate support in accordance with embodiments of the present disclosure.

Figure 1:
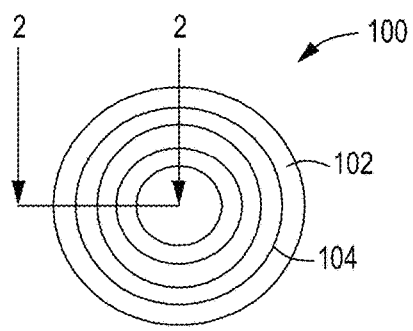
FIG. 1 is a top plan view of a substrate support in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method, system, and apparatus for clamping a substrate are provided herein. Such method, system, and apparatus can control clamping of the substrate based on a measurement of the bow of the substrate. Also, embodiments of a method, system, and apparatus for controlling bow of a substrate are provided herein.

FIG. 1 shows a plan view of a substrate support 100 in accordance with embodiments of the present disclosure. In some embodiments, and as shown in FIGS. 1-5, the substrate support 100 may include a base 102 and a plurality of electrodes 104 embedded in the base 102 and spaced from one another. In some embodiments, and as shown in FIGS. 1-5, the plurality of electrodes 104 may be arranged concentrically. In some embodiments, the base 102 may be formed from at least one dielectric material, such as ceramic oxides, nitrides, polymers like polyimide (PI), benzocyclobutene (BCB), etc., or semiconductors (e.g., silicon). In some embodiments, the plurality of electrodes 104 may be formed from metal, such as by screen printing and sintering metal electrodes within the base.

In some embodiments, the substrate support 100 may be used as an electrostatic chuck. In some embodiments, and as discussed more fully below, the substrate support 100 may be used as a mobile carrier that may be clamped to a substrate and moved throughout a substrate processing system and between processing chambers (e.g., of a cluster tool).

In some embodiments, and as shown in FIGS. 2-5, the substrate support may include a plurality of mesas 106 extending axially (with respect to central axis A) from the base 102 to a contact area 108 for contacting a substrate. The contact areas 108 of the plurality of mesas 106 may collectively define a contact surface of the substrate support 100. In some embodiments, and as shown in FIGS. 2-5, the mesas 106 may be spaced radially from one another with respect to central axis A. In some embodiments, and as shown in FIGS. 2-5, all of the mesas 106 have equal height. As described in greater detail below, in some embodiments, and as shown in FIGS. 20 and 21, the mesas 106 may have different heights.

Figures 2, 3:
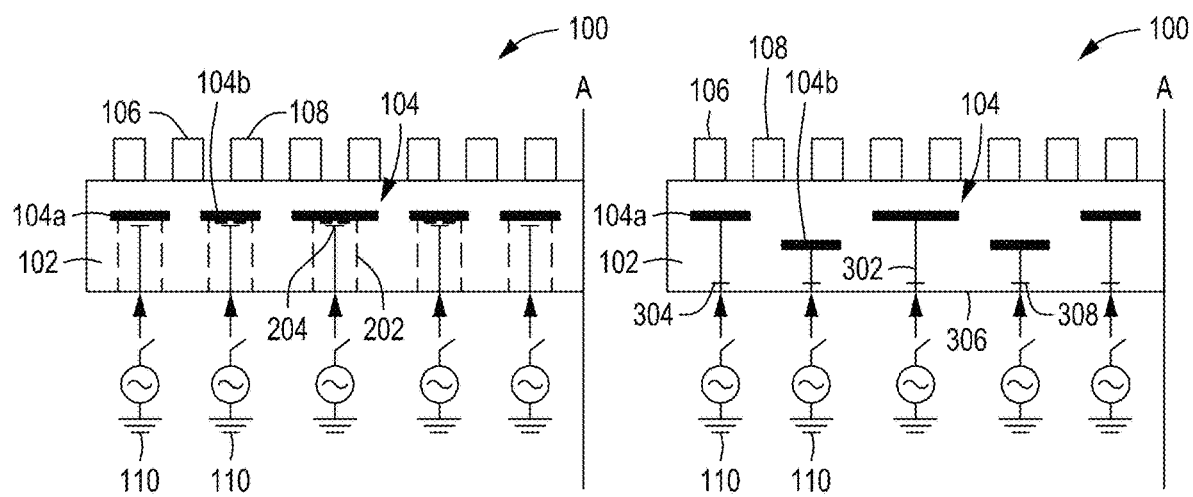
FIG. 2 is a section view of the substrate support shown in FIG. 1 along section 2-2 in FIG. 1.
FIG. 3 shows the substrate support of FIG. 2 modified with electrodes in multiple planes in accordance with embodiments of the present disclosure.
Figures 4, 5:
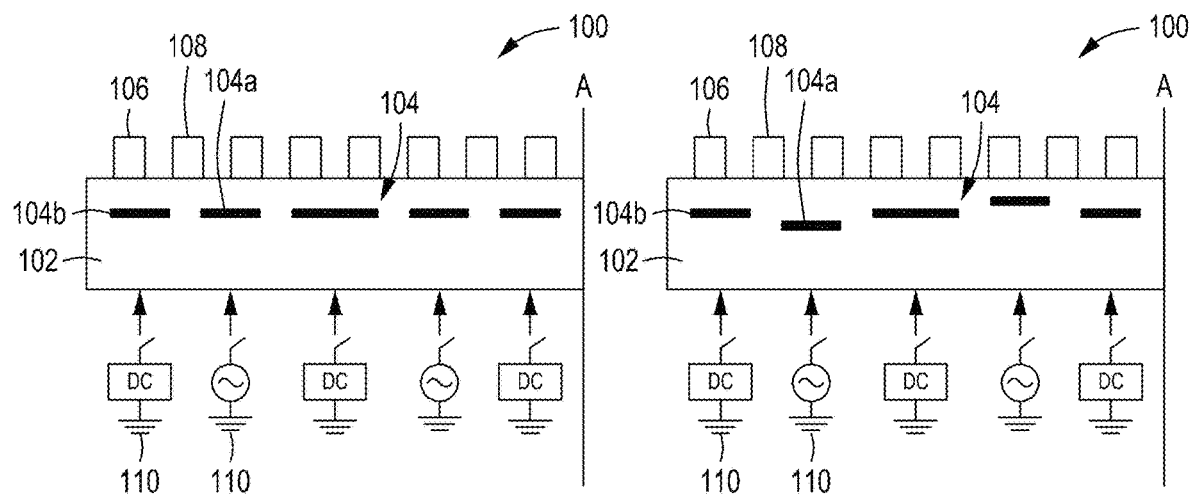
FIG. 4 shows the substrate support of FIG. 2 with electrodes connected to AC and DC voltage supplies in accordance with embodiments of the present disclosure.
FIG. 5 shows the substrate support of FIG. 4 modified with electrodes in multiple planes in accordance with embodiments of the present disclosure.

In some embodiments, and as shown in FIGS. 1-5, the plurality of electrodes 104 may be spaced from one another radially relative to axis A. Also, in some embodiments, and as shown in FIGS. 3 and 5, the plurality of electrodes 104 may be spaced axially relative to central axis A. Also, in some embodiments, the width (measured radially) of the plurality of electrodes 104 may be the same. In some embodiments, and as shown in FIGS. 2-5, the width of the plurality of electrodes 104 may vary.

In some embodiments, and as shown in FIGS. 2-5, the plurality of electrodes 104 may be configured to connect to one or more voltage supplies 110 for generating electrostatic charge to clamp a substrate to the substrate support 100. In some embodiments, and as shown in FIG. 2, the base 102 may have holes 202 exposing the plurality of electrodes 104, which may removably connect to a metal pin (e.g., POGO pin) or a contact 204 connected to a voltage supply 110. In some embodiments, and as shown in FIG. 3, wiring 302 may be embedded within the base 102 extending from each electrode 104 to a corresponding contact 304 on an outer (e.g., lower) surface 306 of the base 102. In some embodiments, the contact 304 may be flush with the outer surface 306 (as shown in FIG. 3) or may be recessed. Such contacts 304 may removably connect to a metal pin (e.g., POGO pin) (not shown) or a contact 308 connected to a voltage supply 110. Also, in some embodiments, the embedded wiring 302 and the plurality of electrodes 104 may be formed together by screen printing and sintering metal traces within the base 102. In some embodiments, a single voltage supply may be used and connected to the plurality of electrodes 104 with a multiplexer.

In some embodiments, and as shown in FIGS. 1-5, the plurality of electrodes 104 may include a first electrode 104a and a second electrode 104b, and the voltage supplies 110, may be configured to apply a first voltage to the first electrode 104a and a second voltage to the second electrode 104b. In some embodiments, the first voltage is an AC voltage and the second voltage is an AC voltage (FIGS. 2 and 3) or a DC voltage (FIGS. 4 and 5). The voltage supplies 110 may be configured to apply the first and second voltages simultaneously or sequentially.

In some embodiments, and as shown in FIGS. 2 and 3, the first electrode 104a is connected to a voltage supply 110 to receive an AC voltage and the second electrode 104b is connected to a voltage supply 110 receive an AC voltage. In some embodiments, one or more of the voltages supplies may be operatively coupled to a controller configured to control the application of voltages to the plurality of electrodes 104. For example, in some embodiments, the controller may control one or more voltage supply 110, which may be configured to supply AC or DC voltage. Each voltage supply 110 may be configured to independently control amplitude, phase, frequency and duty cycle (in the case of AC voltages) to one or more electrodes of the plurality of electrodes 104. In some embodiments, and as shown in FIGS. 4 and 5, the first electrode 104a is connected to a voltage supply 110 configured to supply an AC voltage and a second electrode 104b is connected to a voltage supply 110 configured to supply DC voltage. In some embodiments, the second electrode 104b may also be connected to voltage supply 110 configured to supply AC voltage so that an AC voltage may be superimposed on the DC voltage.

Figure 6A:
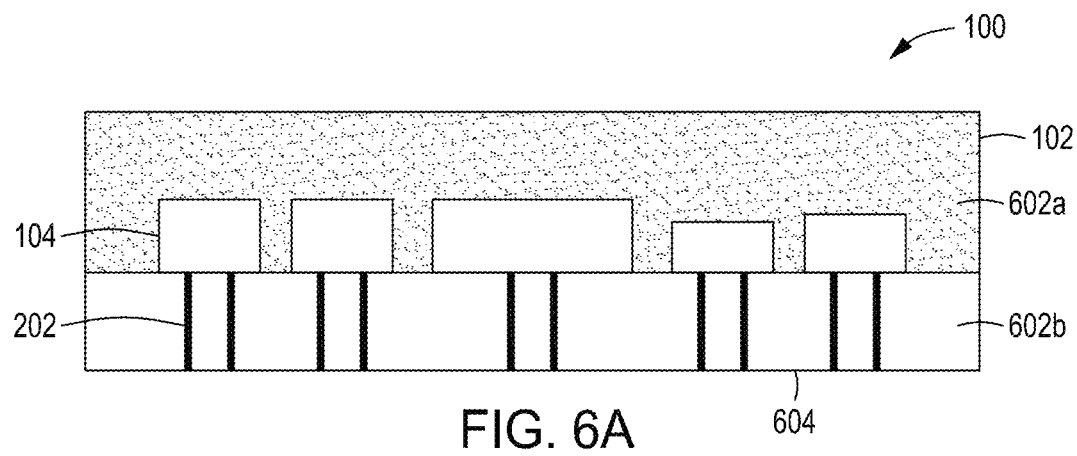
FIG. 6A is a section view of another substrate support in accordance with embodiments of the present disclosure.

FIG. 6A shows an embodiment of a substrate support 100 arranged like the substrate support shown in FIG. 1, but where the base 102 is comprised of an upper dielectric layer 602a and a lower dielectric layer 602b. In the embodiment shown in FIG. 6A, holes 202 are formed in a lower dielectric layer 602b.

In some embodiments the upper dielectric layer 602a and the lower dielectric layer 602b may be formed of one or more dielectric materials such as ceramic oxides, nitrides, polymers (e.g., PI, BCB), or semiconductors (e.g., silicon). In some embodiments, and as shown in FIG. 6A, at least a portion of the base 102 may have a dielectric coating 604. In some embodiments, and as shown in FIG. 6A, the plurality of electrodes 104 may be located in the upper dielectric layer 602a.

Figure 6B:
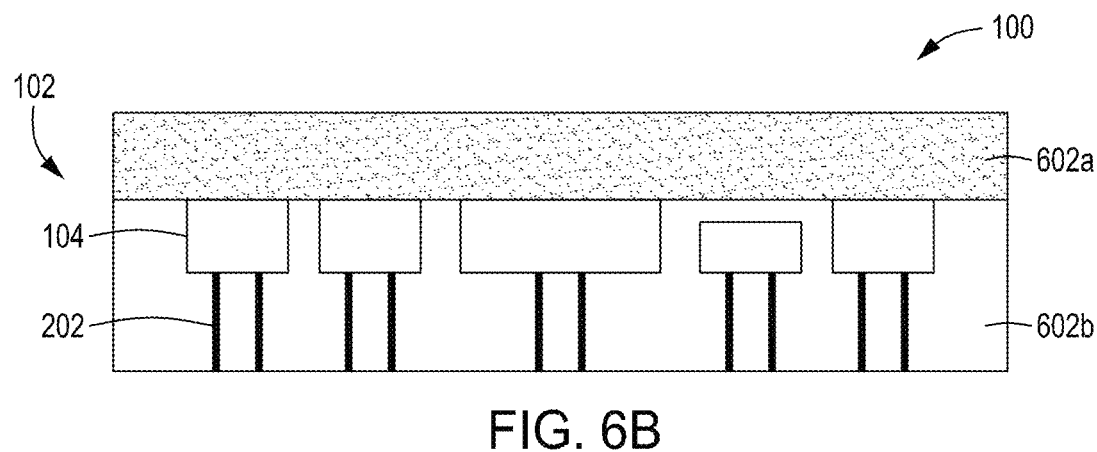
FIG. 6B is a section view of another substrate support in accordance with embodiments of the present disclosure.
Figure 6C:
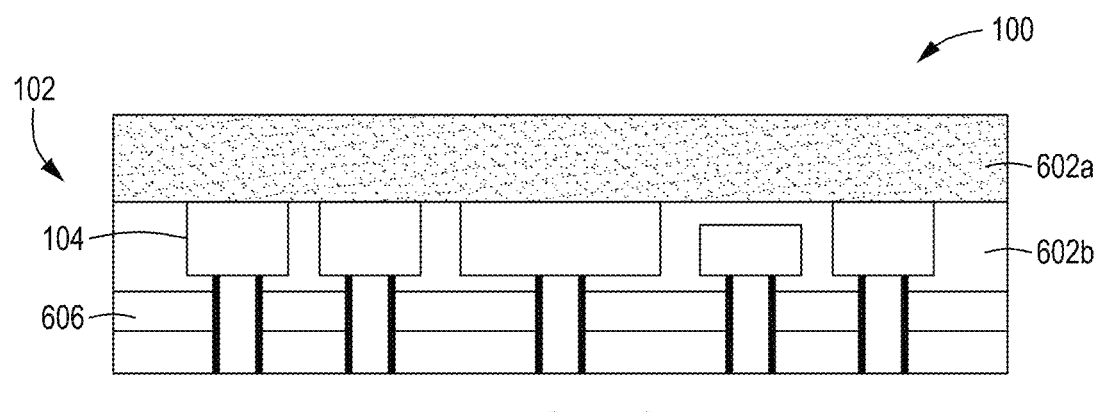
FIG. 6C is a section view of another substrate support in accordance with embodiments of the present disclosure.
Figure 7:
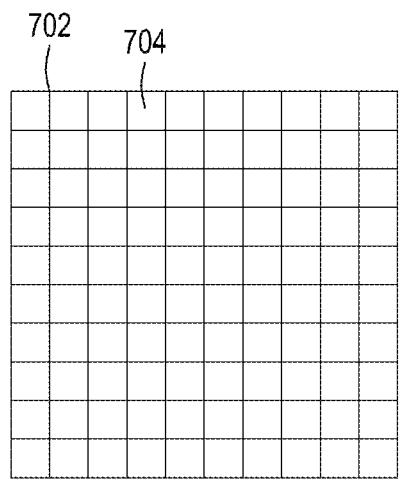
FIG. 7 shows a plan view of an arrangement of electrodes in accordance with embodiments of the present disclosure.

In some embodiments, and as shown in FIG. 6B, the substrate support 100 shown in FIG. 6A may be modified so that the plurality of electrodes 104 are located in the lower dielectric layer 602*b*. In some embodiments, at least one electrode of the plurality of electrodes 104 may be located in two or more dielectric layers, such as the upper dielectric layer 602*a* and the lower dielectric layer 602*b*. Also, in some embodiments, and as shown in FIG. 6C the substrate support shown in FIG. 6B may be further modified by including an embedded material layer 606 made of an insulator, a conductor (e.g., a metal), or a polymer.

Figure 8:
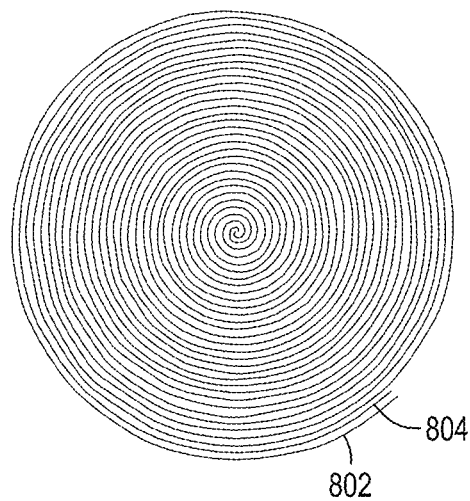
FIG. 8 shows a plan view of an arrangement of electrodes in accordance with embodiments of the present disclosure.
Figure 9:
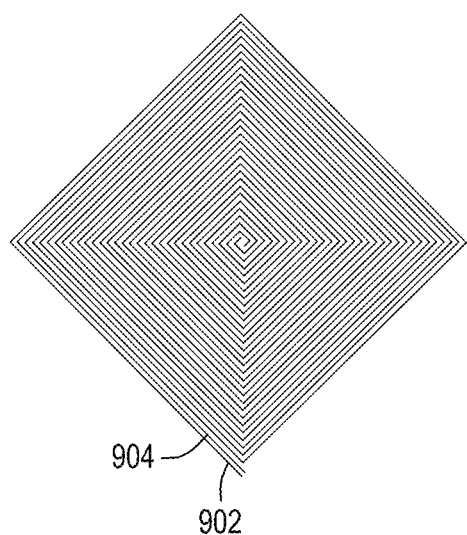
FIG. 9 shows a plan view of an arrangement of electrodes in accordance with embodiments of the present disclosure.
Figure 10:
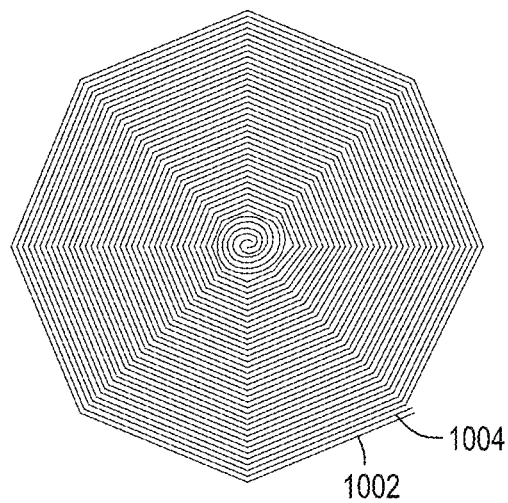
FIG. 10 shows a plan view of an arrangement of electrodes in accordance with embodiments of the present disclosure.

FIGS. 7-11B show additional embodiments of electrode arrangements that may be used for substrate supports in accordance with the present disclosure. In the embodiments shown in FIGS. 7-10, two electrodes are shown. In other embodiments, more than two electrodes may be arranged. In the embodiment shown in FIG. 7, a first electrode 702 may be arranged as a grid or wireframe and a second electrode 704 may be formed as a square above or below the first electrode 702. In some embodiments, and as shown in FIG. 8, a first electrode 802 and a second electrode 804 extend adjacent one another in a substantially round coil. In some embodiments, and as shown in FIG. 9, a first electrode 902 and a second electrode 904 extend adjacent one another in a substantially square or rectangular coil. In some embodiments, and as shown in FIG. 10, a first electrode 1002 and a second electrode 1004 extend adjacent one another in a substantially octagonal coil. The first electrodes and the second electrodes in the arrangements shown in FIGS. 8-10 may be radially spaced and/or axially spaced from one another.

Figure 11A:
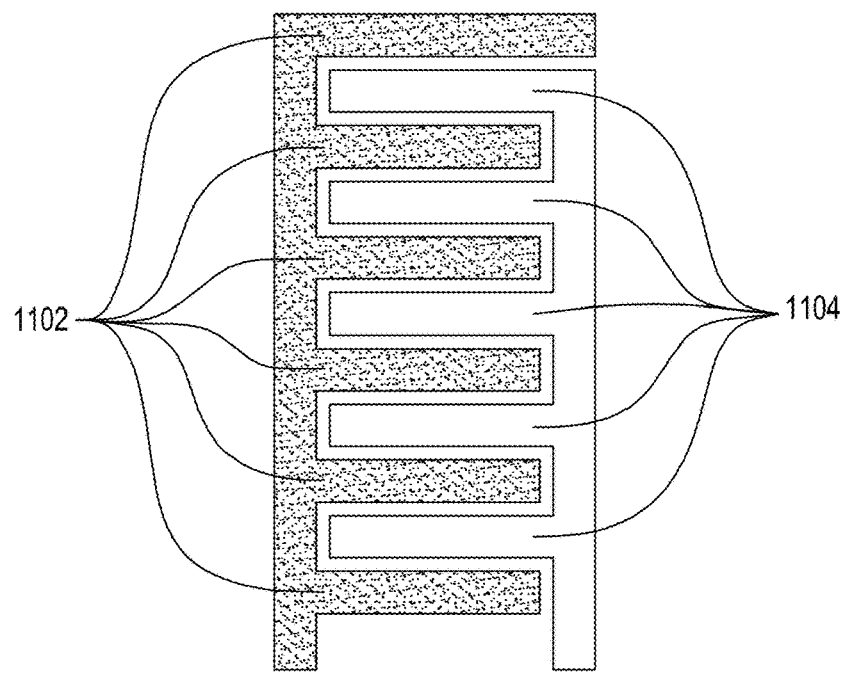
FIG. 11A shows an interdigitated arrangement of electrodes in accordance with embodiments of the present disclosure.
Figure 11B:
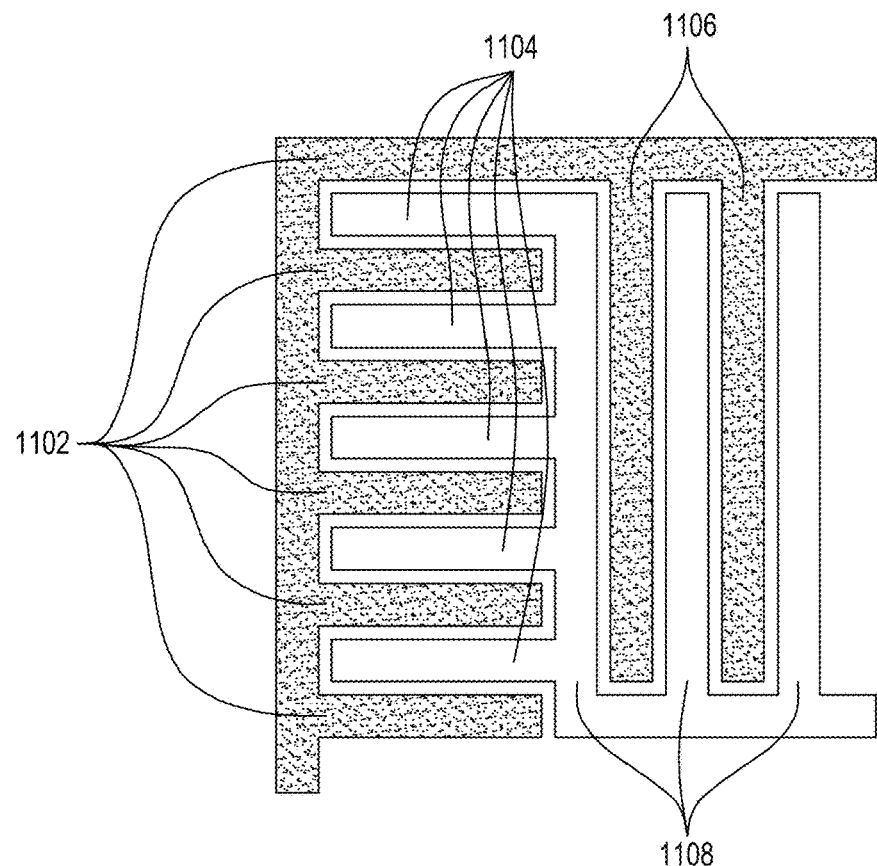
FIG. 11B shows an interdigitated and interlaced arrangement of electrodes in accordance with embodiments of the present disclosure.

FIGS. 11A and 11B show additional electrode arrangements that may be used for substrate supports in accordance with the present disclosure. In some embodiments, and as shown in FIG. 11A, a first plurality of electrodes 1102 may be interdigitated with a second plurality of electrodes 1104 and the first and second plurality of electrodes extend parallel to one another in a horizontal direction. In some embodiments, and as shown in FIG. 11B, a first plurality of electrodes 1102 and a second plurality of electrodes 1104 may be interdigitated so that they extend in parallel to one another in a horizontal direction, and a third plurality of electrodes 1106 and a fourth plurality of electrodes 1108 may be interdigitated so that they extend in parallel with one another a vertical direction. The embodiment shown in FIG. 11B, thus, interlaces the electrodes. Interdigitated electrode arrangements such as those shown in FIGS. 11A and 11B may increase the retention time of electrostatic charge on substrate supports arranged in accordance with embodiments of the present disclosure.

Figure 12:
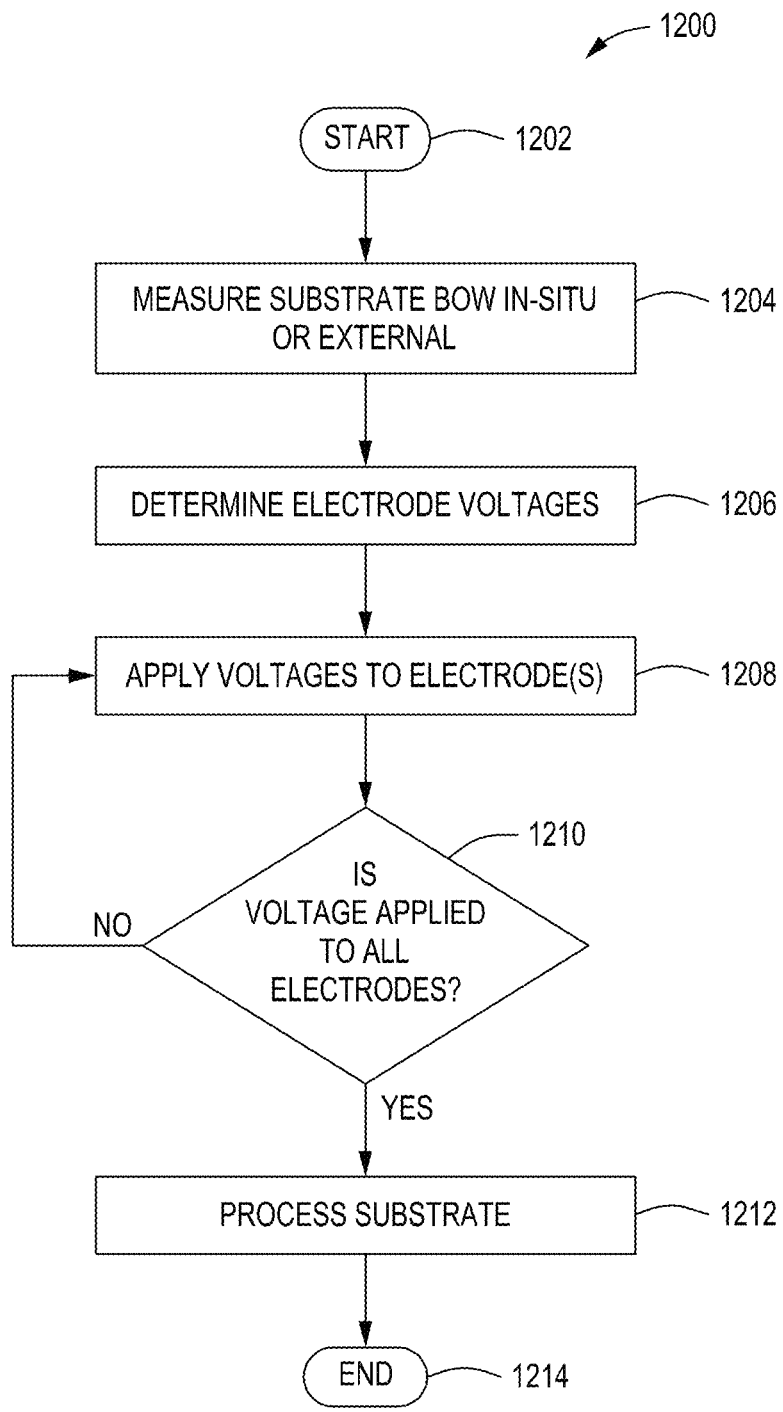
FIG. 12 shows a method of clamping a substrate in accordance with embodiments of the present disclosure.

FIG. 12 shows a method of clamping a substrate using a substrate support in accordance with embodiments of the disclosure. In some embodiments, the method may begin at 1202 by placing the substrate on a support surface (e.g., contact areas 108 of mesas 106) of the substrate support 100. Also, the method may include measuring the bow of the substrate at 1204. The bow may be measured either in-situ after the substrate is placed on the substrate support or ex-situ before the substrate is placed on the substrate support. In some embodiments, the substrate support 100 may be located in a processing chamber and may be part of a movable substrate pedestal housed in the processing chamber. Such processing chambers may be used for lithographic processes, dielectric and conductor etch processes, and deposition processes. In some embodiments, and as described in greater detail below, the substrate support 100 may be separate from a processing chamber and may be used a mobile substrate carrier, as described in greater detail below.

Also, the method may include determining at 1206, based on the measured substrate bow, the voltages to be applied to the plurality of electrodes 104. For example, a first voltage to be applied to the first electrode 104*a* may be determined and a second voltage to be applied to the second electrode 104*b* may be determined. As noted above, in some embodiments, the first voltage may be an AC voltage and the second voltage may be an AC or a DC voltage. In some embodiments, the voltages may be determined using a lookup table of voltages corresponding to bow measurements. In some embodiments, determining a DC voltage to apply to the second electrode may also include determining an AC voltage to superimpose on the DC voltage.

According to some embodiments, at 1208 the determined voltages may be applied to one or more electrodes of the plurality of electrodes 104. For example, the first voltage may be applied to the first electrode 104*a* and the second voltage may be applied to the second electrode 104*b*. The voltages may be applied simultaneously or sequentially. In some embodiments, before substrate processing (e.g., etching or deposition) begins on the substrate, a verification at 1210 may be made as to whether voltage has been applied to all of the electrodes of the plurality of electrodes 104 and, if not (NO at 1210), further voltage determination and application of voltage may occur until voltage is applied to all of the electrodes of the plurality of electrodes 104. According to some embodiments, if voltage is applied to all electrodes of the plurality of electrodes 104 (YES at 1210), then substrate processing at 1212 may take place. In some embodiments, and as shown in FIG. 12, the method may end at 1214 when substrate processing ends.

Figure 13:
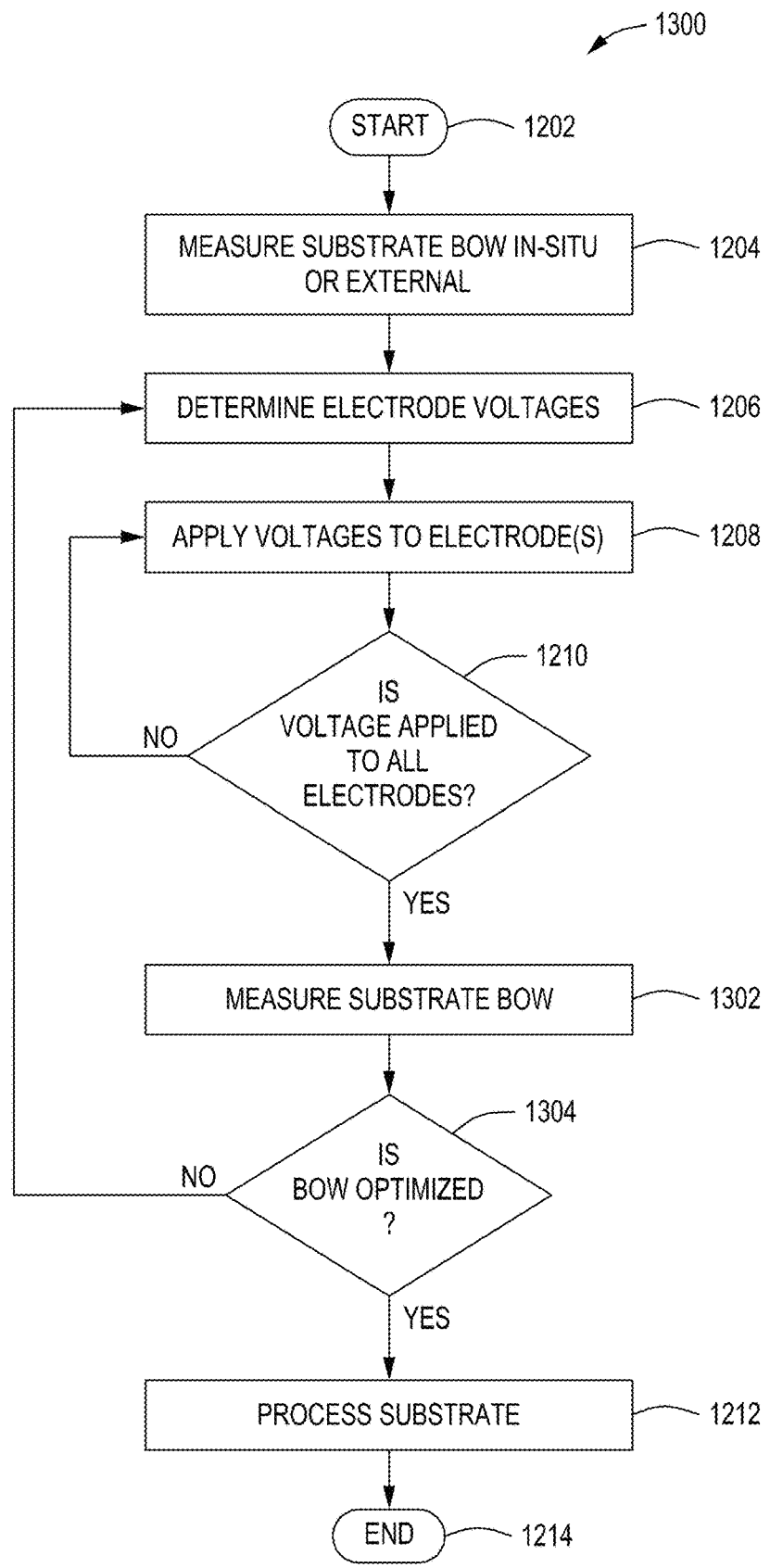
FIG. 13 shows another method of clamping a substrate in accordance with embodiments of the present disclosure.

FIG. 13 shows another method 1300 of clamping a substrate that includes the method 1200 of FIG. 12 modified in accordance with embodiments of the disclosure. Specifically, in some embodiments, the method includes measuring the substrate bow of the same substrate 1302, determining electrode voltages 1206, and applying the voltages to the electrodes 1208 if determined at 1304 that the bow is not optimized (NO at 1304). Otherwise, in such embodiments, if the bow is determined to be optimized (YES at 1304), substrate processing may take place at 1212. Also, in some embodiments, during substrate processing at 1212, the bow measurement may be continuously or periodically checked to determine whether bow is optimized and if not, updated electrode voltages may be determined and applied to the electrodes to adjust the clamping force on the substrate.

Figure 14:
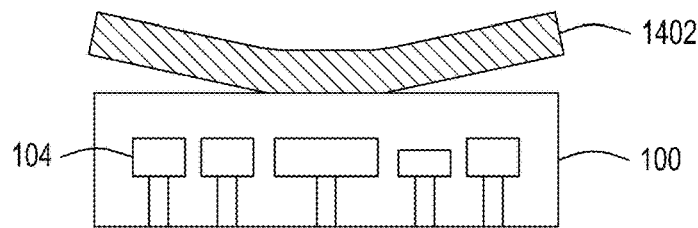
FIG. 14 is a section view of a substrate support and a bowed substrate in an unclamped configuration in accordance with embodiments of the present disclosure.
Figure 15:
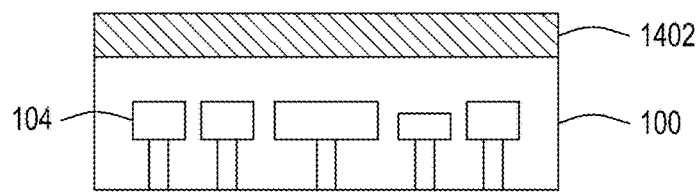
FIG. 15 shows the substrate in FIG. 14 clamped to substrate support in FIG. 14.

In some embodiments, a determination that wafer bow is optimized may be made if at least one of variation in clamp pressure, substrate bow, or heat transfer flux are minimized. In some embodiments, a determination that wafer bow is optimized may be made if at least one of the substrate bow is equal to or less than a predetermined substrate bow (e.g., an average substrate bow), clamp pressure meets or exceeds a predetermined clamp pressure (e.g., an average clamp pressure), or heat transfer flux meets or exceeds a predetermined heat transfer flux (e.g., an average heat transfer flux). As mentioned above, embodiments of substrate supports in accordance with the present disclosure may be used as mobile carriers for carrying substrates throughout a plurality of processing chambers, which may be part of a cluster tool. The substrate supports in accordance with embodiments of the present disclosure may be used as mobile carriers by clamping a substrate to the substrate support according to the embodiments of clamping methods described herein and, once clamped, moving the substrate and the carrier together. For example, in some embodiments, and as shown in FIG. 14, a bowed substrate 1402 may be placed on substrate support 100. Placement of the substrate 1402 and clamping of the substrate 1402 to the substrate support 100 may take place inside or outside a processing chamber according to any of the embodiments of clamping methods described herein. In some embodiments, during clamping, the plurality of electrodes 104 may be connected to voltage supplies such as by connecting pin contacts of the voltage supplies to exposed electrodes of the substrate support, as described above, for example, in connection with substrate support 100. Once the substrate 1402 is clamped to the substrate support 100, the voltage supplies may be disconnected from the plurality of electrodes 104, such as by disconnecting pin contacts of the voltage supplies from the exposed electrodes and discontinuing applying voltages to the plurality of electrodes 104. FIG. 15 shows the substrate 1402 clamped to the substrate support 100 and disconnected from voltage supplies.

After the electrodes 104 are disconnected from the voltage supplies, the substrate 1402 may remain clamped to the substrate support 100 due to residual electrostatic charges present between the substrate 1402 and the substrate support 100. In some embodiments, based on the arrangement of the plurality of electrodes 104 in the substrate support 100, the residual electrostatic charges may have a lifetime on the order of hours to days so that the substrate 1402 may not declamp or release from the substrate support 100 for hours to days.

Figure 16:
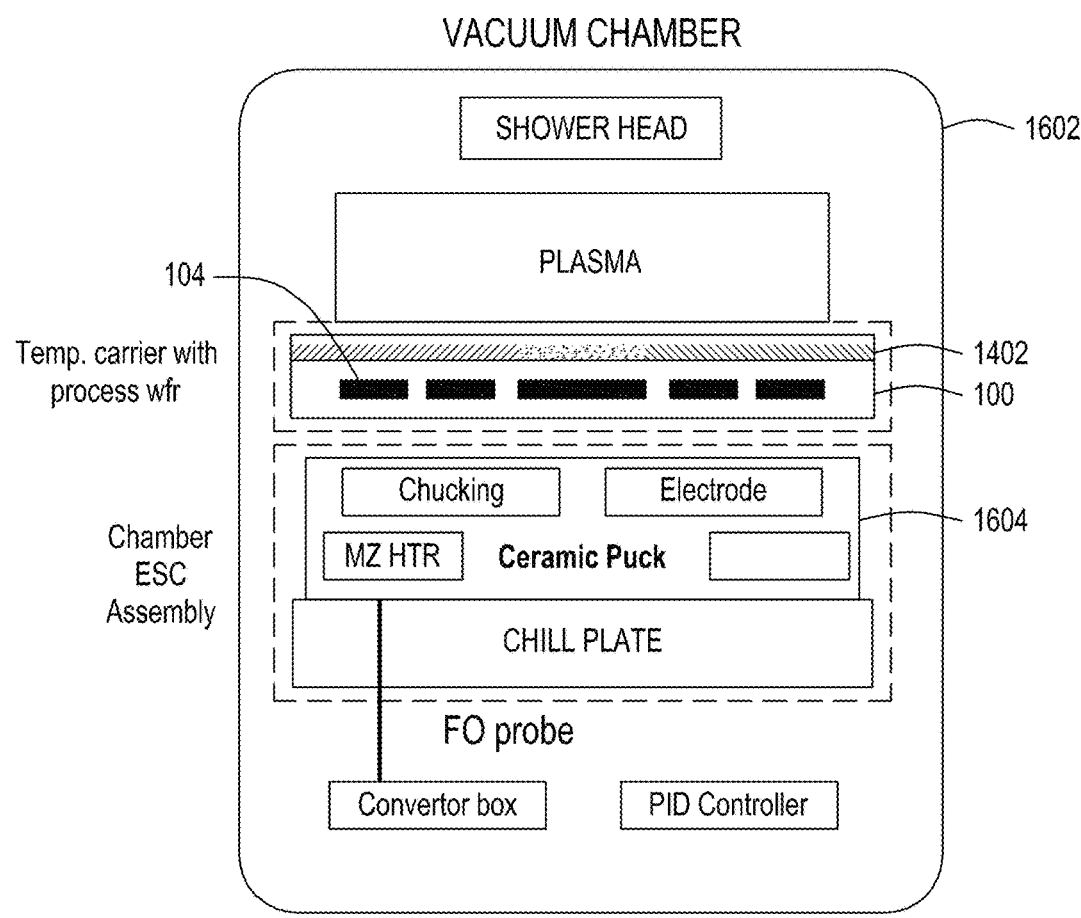
FIG. 16 shows the clamped substrate and substrate support of FIG. 15 in processing chamber and clamped to an electrostatic chuck in accordance with embodiments of the present disclosure.

In some embodiments, after the substrate 1402 is clamped to the substrate support 100, both the substrate 1402 and the substrate support 100 may be moved together into a process chamber 1602 having an electrostatic chuck 1604, as shown in FIG. 16. In some embodiments, and as shown in FIG. 16, the substrate support 100 may be placed on and electrostatically clamped to the electrostatic chuck 1604, thereby securing both the substrate 1402 and the substrate support 100 to the electrostatic chuck 1604. In some embodiments, the electrostatic chuck 1604 may include a plurality of pin contacts configured to contact the plurality of electrodes 104. Such pin contacts may be connected to voltage supplies to apply AC or DC voltages to the plurality of electrodes 104 to permit the clamping forces on the substrate 1402 to be adjusted before and/or during substrate processing as described above. For example, in some embodiments, after transferring the substrate 1402 and the substrate support 100 to the electrostatic chuck an AC or DC voltage (e.g., a third voltage) may be applied to one of the electrodes (e.g., the first electrode 104a) of the plurality of electrodes 104 and an AC or DC voltage (e.g., a fourth voltage) may be applied to another one of the electrodes (e.g., the second electrode 104b) of the plurality of electrodes 104.

In some embodiments, after substrate processing in the processing chamber 1602 is complete, the substrate support 1400 may be declamped from the electrostatic chuck 1604 so that the substrate 1402 and the substrate support 100 may be transferred together out of the processing chamber 1602. In some embodiments, if additional substrate processing is desired, the substrate 1402 and the substrate support 100 may be transferred to another processing chamber for additional substrate processing. Alternatively, in some embodiments, if further substrate processing is not desired, the substrate 1402 may be declamped from the substrate support 100, such as by at least one of applying an ultraviolet (UV) flash to the substrate, applying a reverse voltage to the voltages applied to clamp the substrate, or heat soaking the substrate at an elevated temperature.

FIGS. 17 and 18 show the substrate supports 100 with mesas 106 having different heights in accordance with embodiments of the present disclosure. In some embodiments, the height difference between mesas 106 may vary between 0.1 um-2 mm. In some embodiments, and a shown in FIG. 17, the mesas 106 have contact areas 108 that collectively define a convex support surface of the substrate support 100, which is suitable for supporting a concave surface 1702 of a substrate 1704. In some embodiments, and a shown in FIG. 18, the mesas 106 have contact areas 108 that collectively define a concave support surface of the substrate support 100, which is suitable for supporting a convex surface 1802 of a substrate 1804.

In some embodiments, and as shown in FIGS. 17 and 18, the substrate support 100 may include one or more electrode 1706. For example, in some embodiments, the substrate supports 100 shown in FIGS. 17 and 18 may include a plurality of electrodes 104, as described above. In some embodiments, the varied heights of the mesas 106 may facilitate making even contact between contact areas 108 of the mesas 106 and an uneven or irregular backside surface of a substrate, such as substrates 1704 and 1804, which may, in turn, facilitate localizing surface charges on the substrates 1704 and 1804. Also, improving contact between the mesas 106 and the substrates 1704 and 1804 may improve heat transfer between the substrates 1704, 1804 and the substrate support 100. Moreover, varying the heights of the mesas 106 to more closely match the concave surface 1702 and the convex surface 1802 may reduce the voltages applied to the one or more electrode 1706 and reduce the clamping force on the substrates 1704, 1804. Such reduction in clamping force may further reduce friction (and unwanted particle generation) between the substrates 1704, 1804 and the substrate support 100.

In some embodiments, the plurality of mesas 106 may have the same cross-sectional shape and size. In some embodiments, the cross-sectional shape and size of the mesas 106 may vary. For example, in some embodiments, some mesas of the plurality of mesas 106 may have cylindrical, pyramidal, truncated cone, or annular cross sections. Also, in some embodiments, spacing between mesas 106 in the radial direction may be constant. In some embodiments, radial spacing between one or more mesas 106 may vary.

In some embodiments, the difference in heights between the mesas 106 may be fixed. For example, some substrates may be observed to have a predictable or known bow or irregular backside surface that may be compensated for by a substrate support with fixed mesas having heights to complement the contour of the irregular backside surface. In some embodiments, the height of the mesas 106 may be adjustable to conform to any irregular contour of the backside of a substrate. For example, a substrate may be observed to have a random variation in the backside surface of the substrate for which adjustability of the heights of the mesas 106 may be advantageous to maximize contact between the mesas 106 and the substrate. In some embodiments, the mesas 106 may be independently axially adjustable, such as by respective piezoelectric actuators connected to each mesa 106. In some embodiments the heights of the mesas 106 may be actively adjusted (i.e., with feedback control) based on a measurement of electrostatic clamping force or substrate bow.

A method of controlling substrate bow of a substrate may include selective deposition of material on at least a portion of a backside of the substrate. In some embodiments, the material may include a polymer (e.g., Kapton) or inorganic material (e.g., diamond or diamond-like material). Such selective deposition may be useful to reduce substrate deformation by adding material to the substrate at selective locations on the substrate, thereby advantageously facilitating clamping the substrate with lower clamping voltages. Also, in some embodiments, subtractive processes may be used to remove some excess deposited material. In some embodiments, subtractive processes may include etching. In some embodiments, deposition may include photolithography and inkjet printing. The backside deposition may be performed with or without breaking vacuum.

FIGS. 19-21 shows a method 1900 of controlling substrate bow in accordance with embodiments of the present disclosure. In some embodiments, and as shown in FIG. 20, at the beginning of the method at 1902 a bowed substrate 2000 may be received and at 1904 the bowed substrate 2000 may be clamped to a substrate support 100 in accordance with embodiments of the present disclosure. Also, in some embodiments, the substrate support 100 may include multiple heating elements configured to control the temperature in multiple heating zones of the substrate support.

In some embodiments, and as shown in FIG. 20, at 1906 the backside 2002 may be coated with a coating 2006, which may be heat sensitive. In some embodiments, the coating 2006 may be applied by various methods, such as spraying, inkjet printing, or applying a preformed thin film to the backside of the substrate. The applied coating 2006 may initially have a uniform thickness. In some embodiments, the coating 2006 may be a statistically deterministic non-uniform coating and may be a thin film having differing reactivity rates based on temperature. For example, such coating 2006 may stretch and become thinner when exposed to a higher temperature. In some embodiments, the coating 2006 may be made from insulative oxides, carbides, or nitrides (e.g., silicon oxide/carbide/nitride, aluminum oxide/carbide/nitride).

When clamped, the heating elements may be set to different temperatures for a period of time to apply non-uniform temperatures at 1908 to the substrate 2000 and the coating 2006 so that different portions of the coating 2006 will react and thin at different rates. After the coating 2006 is non-uniformly heated for a period of time, the coating 2006 will have a non-uniform thickness. At 1910, the substrate 2000 may be declamped from the substrate support 2004 leaving the coating 2006 to reinforce the substrate 2000 to prevent the substrate 2000 from returning to a bowed configuration. The method may end at 1912.

Another method of controlling substrate bow in accordance with the present disclosure may include selectively depositing a material on a substrate support surface of an electrostatic chuck to conform more closely to a contour of a backside of a substrate to minimize gaps between the substrate support surface and the backside. The materials and methods for depositing and subtracting material described above for deposition on substrates may also be used for deposition on electrostatic chucks. In some embodiments, after the electrostatic chuck is used for substrate processing, any deposited material may be removed by any subtractive method to prepare the electrostatic chuck for further substrate processing.

FIGS. 22 and 23 show additional embodiments of a substrate support 2200 for clamping a substrate. The substrate support 2200 includes a plurality of pressure zones 2202 separated by a plurality of seal bands 2204 that are configured to seal against a backside surface of a substrate. Such seal bands may be o-rings. In some embodiments, and as shown in FIG. 22, a plurality of pressure zones are pixelated and defined by seal bands 2204 in discrete locations of the substrate support 2200. Such seal bands 2204 may not be coaxially aligned. In some embodiments, and as shown in FIG. 21, a plurality of pressure zones 2202 are annular and defined by coaxially aligned seal bands 2204.

In some embodiments, the pressure in each pressure zone 2202 may be independently controlled to adjust the clamping force on a portion of the substrate sealed to each pressure zone 2202. In some embodiments, each pressure zone 2202 may have a separate vacuum opening 2206 in the substrate support 2200 connected to a vacuum source 2208. Also, in some embodiments, each pressure zone may have a gas supply opening 2210 for supplying a gas, such as helium, to each pressure zone. Gas flow may be used as a heat transfer medium for controlling the temperature of the substrate as well as for pressure control in each pressure zone 2202. Thus, in some embodiments, a gas may be introduced into the same pressure zone 2202 connected to a vacuum source. The pressure in each pressure zone 2202 may be adjusted by regulating at least one of the vacuum source or gas flow.

In use, a substrate may be clamped to the substrate support by placing a backside of the substrate over the substrate support 2200 and into contact with the plurality of seal bands 2204. The bow of the substrate may be measured and the pressure in each pressure zone 2202 may be adjusted to adjust the bow of the substrate. For example, in some embodiments, the pressure in a pressure zone 2202 may be controlled to minimize wafer bow of the substrate.

While the foregoing is directed to embodiments of the present disclosure, other and further embodiments of the disclosure may be devised without departing from the basic scope thereof.

The invention claimed is:

1. A method for clamping a substrate, comprising,
   i. placing a substrate on a clamping surface of a substrate support having a plurality of electrodes spaced from one another including a first electrode and a second electrode;
   ii. measuring substrate bow of the substrate;
   iii. determining, based on the measured substrate bow, a first voltage to be applied to the first electrode and a second voltage to be applied to the second electrode, wherein the first voltage is an AC voltage and the second voltage is an AC or a DC voltage;
   iv. applying the first voltage to the first electrode and the second voltage to the second electrode to clamp the substrate to the substrate support; and
   repeating ii, iii, and iv until substrate bow of the substrate is determined to be optimized,
   wherein the substrate bow of the substrate is determined to be optimized when at least one of variation in clamp pressure or heat transfer flux are minimized.

2. The method of claim 1, further comprising applying a non-uniform coating to the substrate while the substrate is clamped to the substrate support.

3. The method of claim 1, wherein the first voltage and the second voltage are applied sequentially.

4. The method of claim 1, wherein the first voltage and the second voltage are applied simultaneously.

5. The method of claim 1, further comprising:
   discontinuing applying the first voltage to the first electrode and the second voltage to the second electrode;
   transferring the clamped substrate and substrate support together to a processing chamber having an electrostatic chuck and electrostatically coupling the substrate support to the electrostatic chuck; and
   after transferring, applying a third voltage to the first electrode and a fourth voltage to the second electrode, wherein the third voltage is an AC or DC voltage and the fourth voltage is an AC or DC voltage.

6. The method of claim 1, wherein the second voltage is an AC voltage.

7. The method of claim 1, wherein applying the second voltage to the second electrode includes simultaneously applying a DC voltage and an AC voltage to the second electrode.

8. A system for clamping a substrate, comprising,
a substrate support having a surface for supporting a substrate;
a plurality of electrodes spaced from one another in or on the substrate support, the plurality of electrodes including a first electrode and a second electrode; and
a controller configured to receive a measurement of substrate bow of a substrate and to determine, based on the substrate bow, a first voltage to be applied to the first electrode and a second voltage to be applied to the second electrode, and apply the first voltage to the first electrode and the second voltage to the second electrode, wherein the first voltage is an AC voltage and the second voltage is an AC or DC voltage,
wherein the controller is configured to optimize substrate bow of the substrate by repeatedly receiving a measurement of substrate bow, determining the first voltage and the second voltage, and reapplying the first voltage and the second voltage based on the received measurements of substrate bow, and
wherein the substrate bow of the substrate is determined to be optimized when at least one of variation in clamp pressure or heat transfer flux are minimized.

9. The system of claim 8, wherein the plurality of electrodes are interdigitated.

10. The system of claim 8, wherein the controller is configured to sequentially apply the first voltage and the second voltage.

11. The system of claim 8, wherein the controller is configured to simultaneously apply the first voltage and the second voltage.

12. The system of claim 8, further comprising an electrostatic chuck, wherein the substrate support is configured to removably couple to the electrostatic chuck.

13. The system of claim 8, wherein the second voltage is an AC voltage.

14. The system of claim 8, wherein the controller is configured to simultaneously apply a DC voltage and an AC voltage to the second electrode.

15. A non-transitory computer readable storage medium having instructions stored thereon that, when executed by a processor of a system for clamping a substrate having a substrate support with a plurality of electrodes spaced from one another including a first electrode and a second electrode, performs a method of clamping a substrate comprising:
i. placing a substrate on a clamping surface of a substrate support having a plurality of spaced electrodes including a first electrode and a second electrode;
ii. measuring substrate bow of the substrate;
iii. determining, based on the measured substrate bow, a first voltage to be applied to the first electrode and a second voltage to be applied to the second electrode, wherein the first voltage is an AC voltage and the second voltage is an AC or DC voltage;
iv. applying the first voltage to the first electrode and the second voltage to the second electrode;
repeating ii, iii, and iv until substrate bow of the substrate is determined to be optimized,
wherein the substrate bow of the substrate is determined to be optimized when at least one of variation in clamp pressure or heat transfer flux are minimized.

16. The non-transitory computer readable storage medium of claim 15, wherein the second voltage is an AC voltage.

17. The non-transitory computer readable storage medium of claim 15, wherein applying the second voltage to the second electrode includes simultaneously applying a DC voltage and an AC voltage to the second electrode.

* * * * *